(12) United States Patent
Kruger et al.

(10) Patent No.: US 7,365,408 B2
(45) Date of Patent: Apr. 29, 2008

(54) STRUCTURE FOR PHOTOLITHOGRAPHIC APPLICATIONS USING A MULTI-LAYER ANTI-REFLECTION COATING

(75) Inventors: James Bernard Kruger, Half Moon Bay, CA (US); Clint David Snyder, Los Gatos, CA (US); Patrick Rush Webb, San Jose, CA (US); Howard Gordon Zolla, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 70 days.

(21) Appl. No.: 10/135,754

(22) Filed: Apr. 30, 2002

(65) Prior Publication Data

US 2003/0203645 A1    Oct. 30, 2003

(51) Int. Cl.
  *H01L 31/0232* (2006.01)
(52) U.S. Cl. ............... 257/437; 257/436; 257/E21.029; 438/636
(58) Field of Classification Search ................ 257/108, 257/252, 428, 431–432, 435, 436–437; 438/54, 438/57, 69, 65, 72, 636, 48, 77; 428/64.1
See application file for complete search history.

(56) References Cited

U.S. PATENT DOCUMENTS

| | | | |
|---|---|---|---|
| 4,587,138 A * | 5/1986 | Yau et al. .................... | 438/660 |
| 4,663,684 A * | 5/1987 | Kamo et al. .............. | 360/327.2 |
| 4,714,668 A * | 12/1987 | Uneno et al. ................ | 430/316 |
| 4,857,373 A | 8/1989 | Carcia et al. | |
| 5,254,373 A * | 10/1993 | Barr ........................... | 427/498 |
| 5,255,260 A * | 10/1993 | Yamada et al. ............. | 369/199 |
| 5,288,558 A | 2/1994 | Nothe | |
| 5,368,908 A | 11/1994 | Ohta et al. | |
| 5,449,639 A * | 9/1995 | Wei et al. .................... | 438/636 |

(Continued)

FOREIGN PATENT DOCUMENTS

JP    11-283212    * 10/1999

OTHER PUBLICATIONS

Choi et al., "A Novel Anti-Reflective Structure for Metal Layer Patterning," Proceedings of SPIE. vol. 333, Part 1, Feb. 23-25, 1998, pp. 336-346.

(Continued)

*Primary Examiner*—Thao X Le
(74) *Attorney, Agent, or Firm*—William K. Konrad; Konrad Raynes & Victor LLP (57) ABSTRACT

A bi-layer anti-reflective coating for use in photolithographic applications, and specifically, for use in ultraviolet photolithographic processes. The bi-layered anti-reflective coating is used to minimize pattern distortion due to reflections from neighboring features in the construction of microcircuits. The bi-layer anti-reflection coating features a first layer, an absorption layer, disposed on a second layer, a dielectric layer, which is then disposed between a substrate and a photoresist layer. The dielectric/absorption layer comprises one combination selected from $Ta/Al_2O_3$, $Ta/SiO_2$, $Ta/TiO_2$, $Ta/Ta_2O_5$, $Ta/Cr_2O_3$, $Ta/Si_3N_4$, $Ti/Al_2O_3$, $Ti/SiO_2$, $Ti/TiO_2$, $Ti/Ta_2O_5$, $Ti/Cr_2O_3$, $Ti/Si_3N_4$, $Cr/Al_2O_3$, $Cr/SiO_2$, $Cr/TiO_2$, $Cr/Ta_2O_5$, $Cr/Cr_2O_3$, $Cr/Si_3N_4$, $Al/Al_2O_3$, $Al/TiO_2$, $Al/Ta_2O_5$, $Al/Cr_2O_3$, $Al/Si_3N_4$, $Ni/Al_2O_3$, $Ni/SiO_2$, $Ni/TiO_2$, $Ni/Ta_2O_5$, $Ni/Cr_2O_3$, $Ni/Si_3N_4$, $Ir/Al_2O_3$, $Ir/SiO_2$, $Ir/TiO_2$, $Ir/Ta_2O_5$, $Ir/Cr_2O_3$, and $Ir/Si_3N_4$. At least the absorption and dielectric layers can be formed using vacuum deposition. A unique character of the bi-layer anti-reflective coatings is that it allows a thinner anti-reflection layer that has a wider process latitude.

11 Claims, 5 Drawing Sheets

U.S. PATENT DOCUMENTS

| | | | |
|---|---|---|---|
| 5,659,450 A * | 8/1997 | Saito | 360/126 |
| 5,698,352 A * | 12/1997 | Ogawa et al. | 430/14 |
| 5,728,441 A * | 3/1998 | Min et al. | 428/64.1 |
| 5,731,216 A * | 3/1998 | Holmberg et al. | 438/30 |
| 5,733,713 A * | 3/1998 | Yano et al. | 430/316 |
| 5,759,746 A | 6/1998 | Azuma et al. | |
| 5,804,250 A * | 9/1998 | Yang | 427/130 |
| 5,811,971 A * | 9/1998 | Senda et al. | 324/244 |
| 5,831,801 A * | 11/1998 | Shouji et al. | 360/126 |
| 5,926,740 A | 7/1999 | Forbes et al. | |
| 5,963,841 A | 10/1999 | Karlsson et al. | |
| 5,998,100 A | 12/1999 | Azuma et al. | |
| 6,005,277 A | 12/1999 | Liu et al. | |
| 6,010,829 A | 1/2000 | Rogers et al. | |
| 6,037,276 A | 3/2000 | Lin et al. | |
| 6,051,369 A | 4/2000 | Azuma et al. | |
| 6,086,727 A * | 7/2000 | Pinarbasi | 204/192.11 |
| 6,088,908 A * | 7/2000 | Imamura et al. | 29/603.12 |
| 6,136,679 A * | 10/2000 | Yu et al. | 438/592 |
| 6,156,485 A | 12/2000 | Tang et al. | |
| 6,165,855 A | 12/2000 | Besser et al. | |
| 6,200,734 B1 | 3/2001 | Blatchford, Jr. et al. | |
| 6,214,637 B1 * | 4/2001 | Kim et al. | 438/72 |
| 6,312,780 B1 * | 11/2001 | Kasami et al. | 428/64.1 |
| 6,313,969 B1 * | 11/2001 | Hattori et al. | 360/135 |
| 6,335,069 B1 * | 1/2002 | Ogawa et al. | 428/64.1 |
| 6,346,183 B1 | 2/2002 | Baer et al. | |
| 6,501,618 B1 * | 12/2002 | Kamijima et al. | 360/126 |
| 6,510,024 B2 * | 1/2003 | Otsuka et al. | 360/126 |
| 6,686,272 B1 * | 2/2004 | Lee et al. | 438/636 |
| 6,689,682 B1 * | 2/2004 | Ogle et al. | 438/636 |
| 6,720,251 B1 * | 4/2004 | van Schravendijk et al. | 438/636 |
| 6,787,457 B2 * | 9/2004 | Yanagawa et al. | 438/639 |
| 6,849,538 B2 * | 2/2005 | Kwon | 438/636 |
| 6,927,266 B2 * | 8/2005 | Arase et al. | 526/262 |
| 2001/0021089 A1 * | 9/2001 | Miyauchi et al. | 360/324.2 |
| 2001/0026425 A1 * | 10/2001 | Miyazawa et al. | 360/327.31 |
| 2001/0041304 A1 * | 11/2001 | Uno et al. | 430/270.13 |
| 2002/0003684 A1 * | 1/2002 | Nakashio et al. | 360/324.2 |
| 2002/0030950 A1 * | 3/2002 | Sano et al. | 360/324.11 |
| 2002/0044394 A1 * | 4/2002 | Hasegawa | 360/324.1 |
| 2002/0060880 A1 * | 5/2002 | Kawabe et al. | 360/126 |
| 2002/0071210 A1 * | 6/2002 | Kawabe et al. | 360/126 |
| 2002/0078551 A1 * | 6/2002 | Ohtsuka | 29/603.07 |
| 2002/0098315 A1 * | 7/2002 | Tabata | 428/64.4 |
| 2002/0191356 A1 * | 12/2002 | Hasegawa et al. | 360/324.11 |
| 2003/0003395 A1 * | 1/2003 | Yuzurihara et al. | 430/270.13 |
| 2003/0011942 A1 * | 1/2003 | Pinarbasi | 360/324.1 |
| 2003/0053268 A1 * | 3/2003 | Lin et al. | 360/324.1 |
| 2003/0058584 A1 * | 3/2003 | Koike | 360/319 |
| 2003/0064211 A1 * | 4/2003 | Hirotsune et al. | 428/209 |
| 2003/0151851 A1 * | 8/2003 | Sato et al. | 360/126 |

OTHER PUBLICATIONS

Lin et al., "Dual Layer Inorganic SiON Bottom ARC for 0.25 μm DUV Hard Mask Appllications," Proceedings of SPIE, vol. 3678, Mar. 1999, pp. 186-197.

* cited by examiner

STRUCTURE FOR PHOTOLITHOGRAPHIC APPLICATIONS USING A MULTI-LAYER ANTI-REFLECTION COATING

CROSS-REFERENCE TO RELATED APPLICATION

This application is related to the following co-pending and commonly-assigned U.S. patent application, which is hereby incorporated herein by reference in their respective entirety: "METHOD FOR FORMING THIN FILM HEADS USING A TRI-LAYER ANTI-REFLECTION COATING FOR PHOTOLITHOGRAPHIC APPLICATIONS AND A STRUCTURE THEREOF" to Webb et al., having U.S. patent application Ser. No. 10/135,663.

BACKGROUND OF THE INVENTION

1. Field of the Invention

The present invention relates to photolithographic techniques used in thin-film head (TFH) processing. More particularly, the present invention relates to metal-dielectric bi-layer anti-reflective coatings that minimize pattern distortion due to reflections from neighboring features.

2. Description of Related Art

Thin-film magnetic recording heads have gained wide acceptance in the data storage industry. A thin-film recording head has a small, precisely formed structures that are formed using several thin-film deposition approaches. Manufacturers seek to form the geometry of the recording heads with high precision, and to thereby achieve geometries that provide magnetic field patterns suitable for writing narrow tracks of recorded data.

Typically, the lithographic technique deposits alternating layers of conductive and insulating materials onto a substrate by an evaporation, sputtering, plating, or other deposition technique that provides precise control of the deposition thicknesses. Chemical etching, reactive ion etching (RIE), or other mechanisms shape and form the deposited layers into a pole-tip assembly having the desired geometry. Thus, the head structure is a multi-layer lithographically fabricated device.

Although existing lithographic techniques work sufficiently well to provide head structures, e.g., pole-tip assemblies, with feature sizes suitable for current data storage capacity, these lithographic techniques are limited as to the small feature sizes that they can produce.

Thin film heads require sharply defined photoresist patterns because these patterns are used to define the locations (and density) of structures formed. In a thin film process, a thin layer of photoresist may be applied to the surface of a wafer. The wafer is heated in a process called soft baking, wherein partial evaporation of photoresist solvents evaporate. A mask is then aligned over the wafer, wherein the mask allows light to pass through its clear areas and be blocked by opaque areas during a light exposure step. However, during the exposure step, light reflects from the surface of an underlying substrate (or neighboring features) over which the photoresist is formed. For example, materials that are used to formed the thin film head structure are highly reflective, e.g., copper, tantalum and alloys of nickel, iron and cobalt. Reflections from the surface of the substrate underlying the photoresist also causes deleterious effects that limit the resolution of photolithographic photoresist patterning.

These deleterious effects are caused during the development step by light passing through the photoresist at least twice, rather than only once. This occurs because light is reflected from a surface of the underlying substrate and components (or features) and passes back through the photoresist layer a second time. The chemical structure of the photoresist changes differently when light passes through the photoresist more than once. A portion of the light, already reflected from the surface of the underlying substrate can also reflect again from the surface of the photoresist, passing back through the photoresist yet again. In fact, standing light waves can result in the photoresist from superpositioning of incident and reflected light rays. These reflections result in process latitude and control problems.

The reflection of the light reduces the sharpness of the resulting photoresist pattern. A portion of the light reflected obliquely from the surface of the underlying substrate can also be again reflected obliquely from the surface of the photoresist. As a result of such angular reflections, the light can travel well outside those photoresist regions underlying the transmissive portions of the photolithographic mask. This potentially causes photoresist exposure well outside those photoresist regions underlying transmissive portions of the photolithographic mask. This problem results in a less sharply defined photoresist pattern that limits the density of structures formed on the integrated circuit.

The problem occurring from such reflections during the exposure step have been addressed by applying a bottom anti-reflective coating (BARC). The BARC layer minimizes reflected light during the photoexposure step thereby resulting in more faithfully reproduced trench walls. However, in most anti-reflective coatings, the anti-reflective layers need to be fine-tuned for greater process latitude. Thus, the thickness of the layers of the anti-reflective coating must be precisely controlled to obtain proper absorption of the reflected light in a particular application. Also, some BARCs are spun-on to wafers. When these spun-on coatings are applied over features with significant topography, the thickness of the coating varies. This can compromise their effectiveness as a BARC and make subsequent processing (removal) difficult or impossible.

In addition, after photoresist exposure, a BARC must be cleared from the developed-away regions of the photoresist. This may be performed using RIE, wet chemistry, sputter etch, ion milling, etc. Thinner, more uniformly distributed, BARCs permit quick removal within minimum "over etch." This is important since these processes may have the undesired side-effect of consuming some of the critical dimension (CD) budget because they (depending on materials choices and chemistry) consume photoresist or re-deposit non-volatile BARC-byproducts on the photoresist sidewalls.

It can be seen that there is a need to create an effective anti-reflective layer to make subsequent processing easier.

It can also be seen that there is a need to provide a thinner anti-reflective layer with wider process latitude.

SUMMARY OF THE INVENTION

To overcome the limitations in the prior art described above, and to overcome other limitations that will become apparent upon reading and understanding the present specification, the present invention discloses a method for forming thin film heads using a bi-layer anti-reflection coating for photolithographic applications and a structure thereof.

The present invention solves the above-described problems by providing conformal bi-layer bottom anti-reflection coatings that includes an absorbing layer, which has an extinction coefficient (k) not equal to zero for a predetermined wavelength, and a dielectric layer, which has a substantially zero absorption for a predetermined wavelength.

A method for forming thin film magnetic heads in accordance with the principles of the present invention includes forming a dielectric layer on a surface and forming an absorption layer on the dielectric layer, wherein the absorption layer and dielectric layer are conformal to the surface and wherein the dielectric/absorption layer comprises one combination selected from $Ta/Al_2O_3$, $Ta/SiO_2$, $Ta/TiO_2$, $Ta/Ta_2O_5$, $Ta/Cr_2O_3$, $Ta/Si_3N_4$, $Ti/Al_2O_3$, $Ti/SiO_2$, $Ti/TiO_2$, $Ti/Ta_2O_5$, $Ti/Cr_2O_3$, $Ti/Si_3N_4$, $Cr/Al_2O_3$, $Cr/SiO_2$, $Cr/TiO_2$, $Cr/Ta_2O_5$, $Cr/Cr_2O_3$, $Cr/Si_3N_4$,$Al/Al_2O_3$, $Al/TiO_2$, $Al/Ta_2O_5$, $Al/Cr_2O_3$, $Al/Si_3N_4$, $Ni/Al_2O_3$, $Ni/SiO_2$, $Ni/TiO_2$, $Ni/Ta_2O_5$, $Ni/Cr_2O_3$, $Ni/Si_3N_4$, $Ir/Al_2O_3$, $Ir/SiO_2$, $Ir/TiO_2$, $Ir/Ta_2O_5$, $Ir/Cr_2O_3$, and $Ir/Si_3N_4$.

A bi-layer bottom anti-reflection coating for minimizing pattern distortion in photolithography in accordance with the principles of the present invention includes a dielectric layer of a first thickness formed on a surface and an absorption layer of a second thickness formed on the dielectric layer, wherein the absorption layer and dielectric layer are conformal to the surface and wherein the dielectric/absorption layer comprises one combination selected from $Ta/Al_2O_3$, $Ta/SiO_2$, $Ta/TiO_2$, $Ta/Ta_2O_5$, $Ta/Cr_2O_3$, $Ta/Si_3N_4$, $Ti/Al_2O_3$, $Ti/SiO_2$, $Ti/TiO_2$, $Ti/Ta_2O_5$, $Ti/Cr_2O_3$, $Ti/Si_3N_4$, $Cr/Al_2O_3$, $Cr/SiO_2$, $Cr/TiO_2$, $Cr/Ta_2O_5$, $Cr/Cr_2O_3$, $Cr/Si_3N_4$, $Al/Al_2O_3$, $Al/TiO_2$, $Al/Ta_2O_5$, $Al/Cr_2O_3$, $Al/Si_3N_4$, $Ni/Al_2O_3$, $Ni/SiO_2$, $Ni/TiO_2$, $Ni/Ta_2O_5$, $Ni/Cr_2O_3$, $Ni/Si_3N_4$, $Ir/Al_2O_3$, $Ir/SiO_2$, $Ir/TiO_2$, $Ir/Ta_2O_5$, $Ir/Cr_2O_3$, and $Ir/Si_3N_4$.

A bottom anti-reflection structure in accordance with the principles of the present invention includes a conductive layer formed on a surface, a dielectric layer of a first thickness formed the conductive layer, an absorption layer of a second thickness formed on the dielectric layer, wherein the absorption layer and dielectric layer are conformal to the surface and a photoresist layer formed on the absorption layer, wherein light is fully absorbed between the surface and the photoresist layer and wherein the dielectric/absorption layer comprises one combination selected from $Ta/Al_2O_3$, $Ta/SiO_2$, $Ta/TiO_2$, $Ta/Ta_2O_5$, $Ta/Cr_2O_3$, $Ta/Si_3N_4$, $Ti/Al_2O_3$, $Ti/SiO_2$, $Ti/TiO_2$, $Ti/Ta_2O_5$, $Ti/Cr_2O_3$, $Ti/Si_3N_4$, $Cr/Al_2O_3$, $Cr/SiO_2$, $Cr/TiO_2$, $Cr/Ta_2O_5$, $Cr/Cr_2O_3$, $Cr/Si_3N_4$, $Al/Al_2O_3$, $Al/TiO_2$, $Al/Ta_2O_5$, $Al/Cr_2O_3$, $Al/Si_3N_4$, $Ni/Al_2O_3$, $Ni/SiO_2$, $Ni/TiO_2$, $Ni/Ta_2O_5$, $Ni/Cr_2O_3$, $Ni/Si_3N_4$, $Ir/Al_2O_3$, $Ir/SiO_2$, $Ir/TiO_2$, $Ir/Ta_2O_5$, $Ir/Cr_2O_3$, and $Ir/Si_3N_4$.

A thin film magnetic head in accordance with the principles of the present invention is formed by a method that includes forming a dielectric of a first thickness on a surface and forming an absorption layer of a second thickness on the dielectric layer, wherein the absorption layer and dielectric layer are conformal to the surface and wherein the dielectric/absorption layer comprises one combination selected from $Ta/Al_2O_3$, $Ta/SiO_2$, $Ta/TiO_2$, $Ta/Ta_2O_5$, $Ta/Cr_2O_3$, $Ta/Si_3N_4$, $Ti/Al_2O_3$, $Ti/SiO_2$, $Ti/TiO_2$, $Ti/Ta_2O_5$, $Ti/Cr_2O_3$, $Ti/Si_3N_4$, $Cr/Al_2O_3$, $Cr/SiO_2$, $Cr/TiO_2$, $Cr/Ta_2O_5$, $Cr/Cr_2O_3$, $Cr/Si_3N_4$, $Al/Al_2O_3$, $Al/TiO_2$, $Al/Ta_2O_5$, $Al/Cr_2O_3$, $Al/Si_3N_4$, $Ni/Al_2O_3$, $Ni/SiO_2$, $Ni/TiO_2$, $Ni/Ta_2O_5$, $Ni/Cr_2O_3$, $Ni/Si_3N_4$, $Ir/Al_2O_3$, $Ir/SiO_2$, $Ir/TiO_2$, $Ir/Ta_2O_5$, $Ir/Cr_2O_3$, and $Ir/Si_3N_4$.

A storage device in accordance with the principles of the present invention includes at least one data storage medium mounted for simultaneous rotation about an axis, at least one magnetic head mounted on an actuator assembly for reading and writing data on the at least one data storage medium and an actuator motor for moving the at least one magnetic head relative to the at least one data storage medium, wherein the head is formed using a photoresist process and wherein at least one stage in the photoresist process includes forming a bi-layer anti-reflective coating for minimizing pattern distortion in photolithography, the forming the bi-layer anti-reflective coating including forming a dielectric layer on a surface and forming an absorption layer on the dielectric layer, wherein the absorption layer and dielectric layer are conformal to the surface and wherein the dielectric/absorption layer comprises one combination selected from $Ta/Al_2O_3$, $Ta/SiO_2$, $Ta/TiO_2$, $Ta/Ta_2O_5$, $Ta/Cr_2O_3$, $Ta/Si_3N_4$, $Ti/Al_2O_3$, $Ti/SiO_2$, $Ti/TiO_2$, $Ti/Ta_2O_5$, $Ti/Cr_2O_3$, $Ti/Si_3N_4$, $Cr/Al_2O_3$, $Cr/SiO_2$, $Cr/TiO_2$, $Cr/Ta_2O_5$, $Cr/Cr_2O_3$, $Cr/Si_3N_4$, $Al/Al_2O_3$, $Al/TiO_2$, $Al/Ta_2O_5$, $Al/Cr_2O_3$, $Al/Si_3N_4$, $Ni/Al_2O_3$, $Ni/SiO_2$, $Ni/TiO_2$, $Ni/Ta_2O_5$, $Ni/Cr_2O_3$, $Ni/Si_3N_4$, $Ir/Al_2O_3$, $Ir/SiO_2$, $Ir/TiO_2$, $Ir/Ta_2O_5$, $Ir/Cr_2O_3$, and $Ir/Si_3N_4$.

These and various other advantages and features of novelty which characterize the invention are pointed out with particularity in the claims annexed hereto and form a part hereof. However, for a better understanding of the invention, its advantages, and the objects obtained by its use, reference should be made to the drawings which form a further part hereof, and to accompanying descriptive matter, in which there are illustrated and described specific examples of an apparatus in accordance with the invention.

BRIEF DESCRIPTION OF THE DRAWINGS

Referring now to the drawings in which like reference numbers represent corresponding parts throughout.

DETAILED DESCRIPTION OF THE INVENTION

In the following description of the exemplary embodiment, reference is made to the accompanying drawings, which form a part hereof, and in which is shown by way of illustration the specific embodiment in which the invention may be practiced. It is to be understood that other embodiments may be utilized as structural changes may be made without departing from the scope of the present invention.

The present invention is a photolithographic technique used in thin-film head (TFH) processing. More particularly, a bottom anti-reflective coating (BARC) is used to minimize pattern distortion due to reflections from neighboring features. In photolithographic applications for thin film heads, a BARCs according to the present invention minimizes critical dimension and exposure variations.

Figure 1:
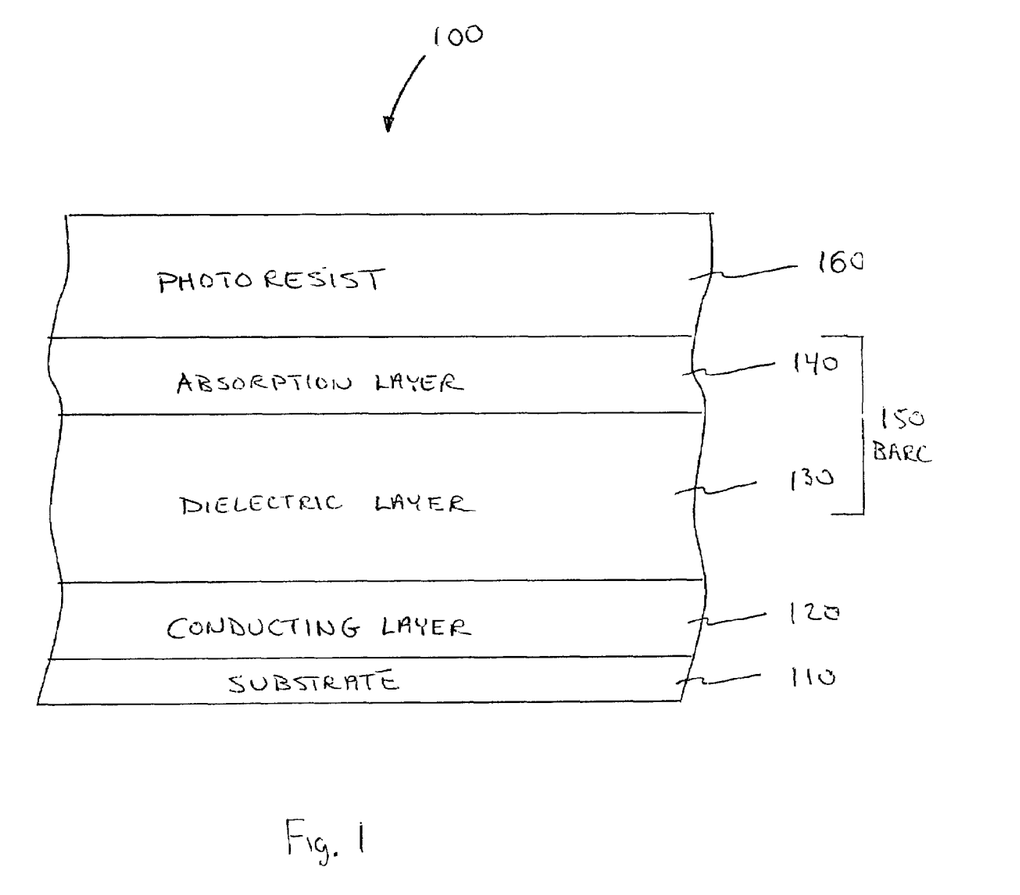
FIG. 1 is an illustration of a bi-layer metal-dielectric anti-reflection coating for photolithographic applications according to the present invention.

FIG. 1 is an illustration of a bi-layer metal-dielectric anti-reflection coating for photolithographic applications 100 according to the present invention. When the conducting layers 120 are made of reflective materials (e.g. metallic materials), anti-reflective coatings (ARCs) have been applied to reduce surface reflection. Typical surfaces benefiting from ARCs are layers formed of NiFe, FeN, aluminum, copper, titanium, or other reflective metals and their alloys. ARCs improve photoresist patterning control by reducing standing wave effects or diffuse scattering caused by reflection of radiation off reflective surfaces. These problems are magnified when monochromatic illumination sources are used.

Bottom anti reflective coating 150 may be deposited, before the photoresist 160, to prevent the reflection of light that passes through the photoresist 160, reflected off the substrate 110, reflective material 120, or other reflective features, and back into the photoresist 160, where it can interfere with incoming light and cause the resist to be unevenly exposed. Further, as the industry transitions to light with shorter wavelengths—from 248 nm to 150 nm and beyond, the challenges of minimizing reflections increase. Accordingly, as the wavelengths become shorter, the reflectivity of the substrate becomes higher, and as a result there are more problems with interference effects that affect the ability to get consistency in resist patterns.

Thus, one embodiment of the present invention resolves the problem by adding a BARC 150 to minimize pattern distortion due to reflections from neighboring features. The BARC 150 minimizes critical dimensions and exposure variations due to photoresist thickness (swing curve) effects. However, to be effective a BARC 150, the BARC 150 must have appropriate complex refractive index ($\tilde{n}=n+ik$, wherein n+ik is the real and imaginary parts of the complex refractive index $\tilde{n}$) and thickness so that reflections between substrate 110 (and/or reflective material 120) and photoresist 160 are fully damped. Thus, such a BARC 150 may be positioned between the substrate 110 and the photoresist 160 in photolithographic applications.

In embodiments of the present invention, a structure of a bi-layer BARC 150 consists of a first BARC layer 130, which is a dielectric layer such as $AL_2O_3$, $SiO_2$, $TiO_2$, $Ta_2O_5$, $Cr_2O_3$, $Si_3N_4$ etc. that has a substantially zero absorption, and a second BARC layer 140, which is an absorbing layer such as Ta, Ti, Cr, Al, Ni, Ir etc. that has an extinction coefficient (k) not equal to zero.

In the present invention, the effective thickness and refractive index of the bi-layer BARC structure 150 can be optimized to produce near-perfect AR properties. This optimization is possible by varying the thickness of the first 130 and second 140 BARC layers. In particular, the second BARC layer 140 may be varied on an overall percentage more that the first BARC layer 130 because of greater reflection in the first BARC layer 130. Thus, the present invention provides thinner BARC films with wider process latitude. Also, the BARC layers 130, 140 may be formed, for example, using a vacuum deposition process. The BARC layer 150 is formed by a vacuum deposition, such as chemical vapor deposition (CVD), physical vapor deposition (PVD), or ion beam deposition (IBD).

Figure 2:
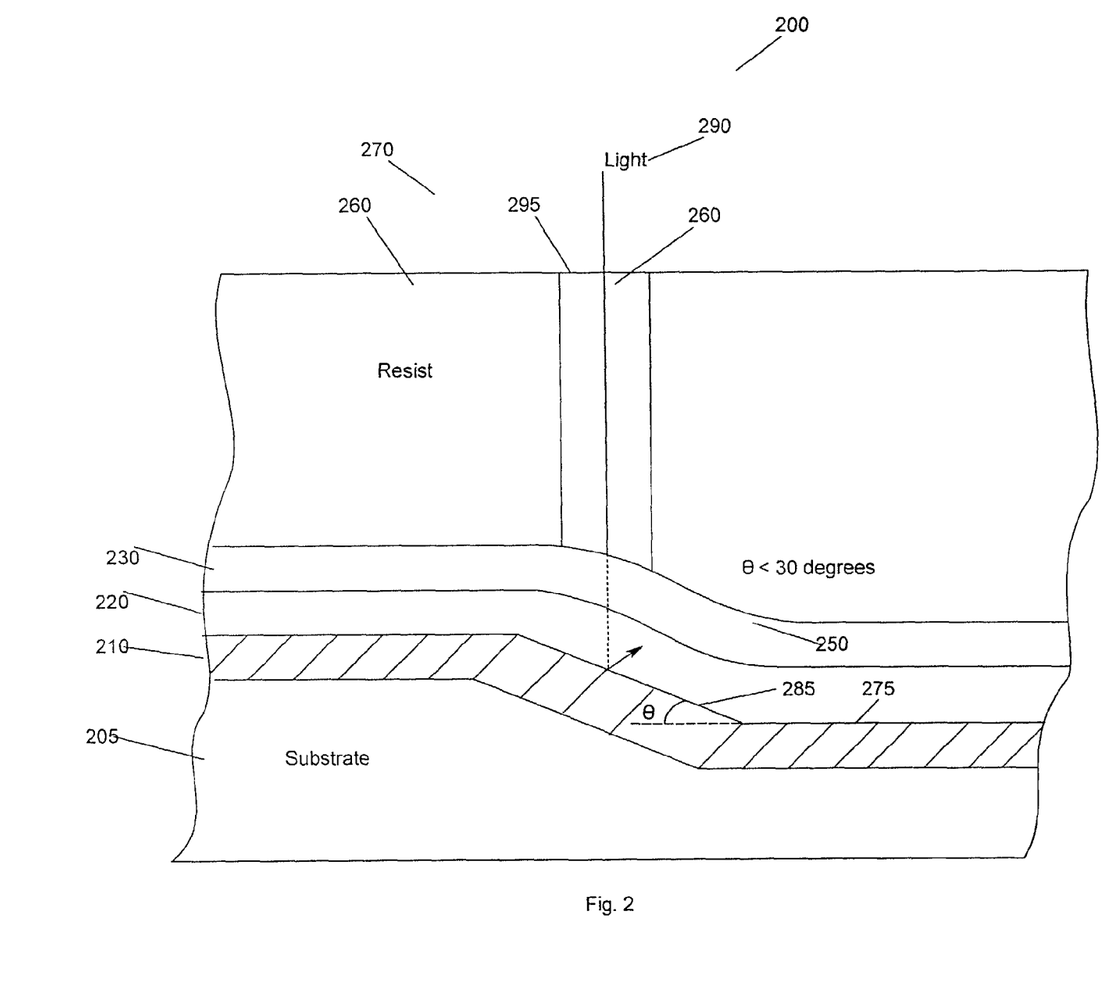
FIG. 2 illustrates the reflection of light in one embodiment of a bi-layer metal-dielectric anti-reflection coating according to the present invention.

FIG. 2 illustrates the reflection of light in one embodiment of a bi-layer metal-dielectric anti-reflection coating 200 according to the present invention. One component 290 of light, such as deep ultra-violet light (DUV) arriving from an environment 270, penetrates a photoresist surface 295 into the photoresist layer 260. The light 290 continues through the photoresist layer 260 into an absorption layer 230. The light 290 continues to travel into a dielectric layer 220. In the present invention, the effective thickness and refractive index of the bi-layer BARC structure comprising dielectric layer 220 and absorption layer 230 can be optimized to produce near-perfect AR properties. This optimization is possible by varying the thickness of the dielectric 220 and absorption 230 layers. Nevertheless, the detailed functioning of the bi-layer BARC structure comprising dielectric layer 220 and absorption layer 230 requires a detailed solution to wave equations and solving for maximum interference in the spacer and maximum attention in the absorber.

Thus, the light 290 may enter a surface that has topography, wherein part of the reflective structure's 210 surface 275 may be flat and having a first angle (not shown) of zero degrees. That means, for example, the angle of zero degrees is the same angle as the incident light 290. Also, the topology may have a second angle 285 being defined by a feature, which is not flat, but rather rises up from the surface 275 at an angle 285. The bi-layer anti-reflective coating 220, 230 that is deposited conformally over this topography is successful in greatly reducing the amount of reflected light.

Figure 3:
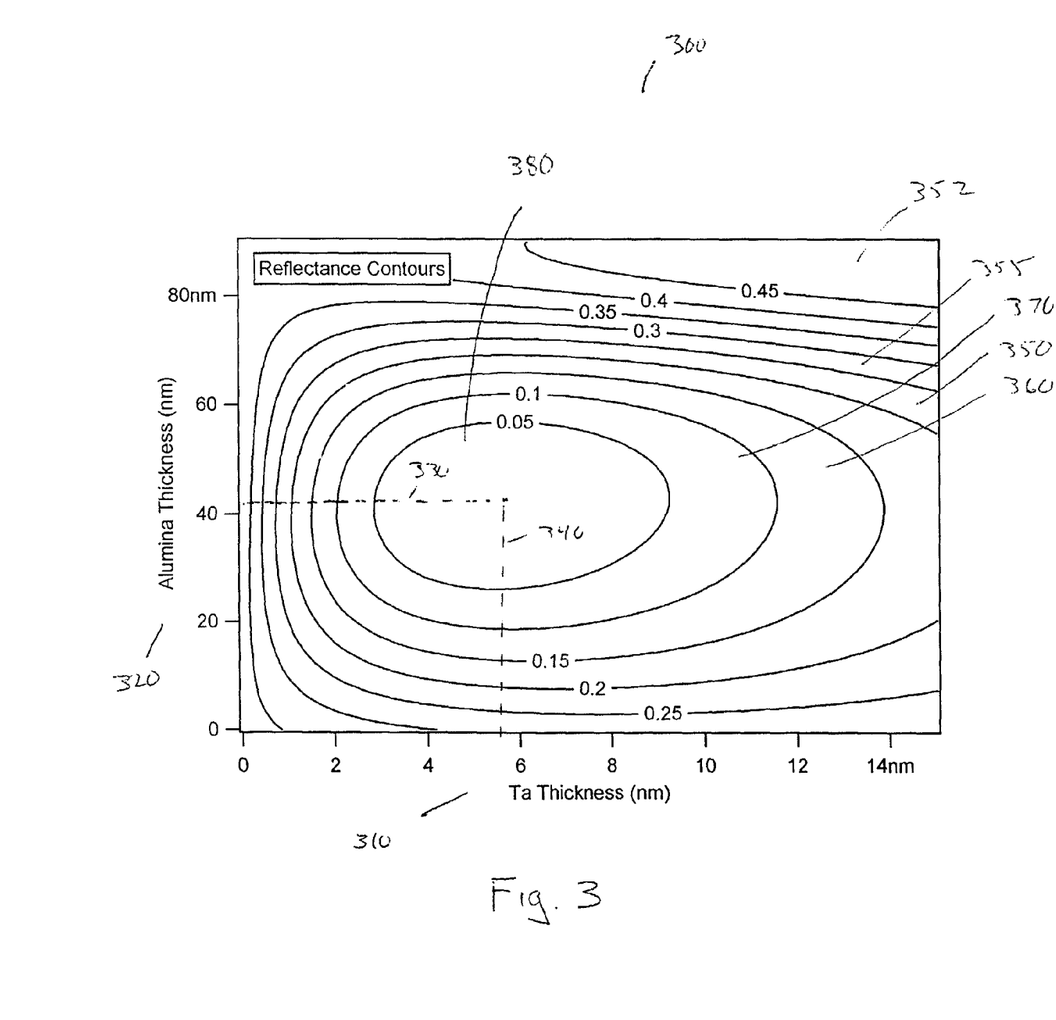
FIG. 3 illustrates the reflectivity in one embodiment of an anti-reflective coating as a function of a dielectric and an absorption layer thickness according to the present invention.

FIG. 3 illustrates the reflectivity in one embodiment of an anti-reflective coating (ARC) as a function of a dielectric and an absorption layer thickness 300 according to the present invention. In this embodiment, a representative calculation for a structure including a photoresist, absorption, dielectric and metal layers, such as resist, bi-layer, Ta (layer 2) 310, $AL_2O_3$ (layer 3) 320, $Ni_{45}Fe_{55}$, respectively, is shown at a wavelength of 365 nm. A method for calculating the reflectance contour is provided in Anders, Thin Films in Optics, Focal Press, © 1967, Section 1.3.

The optimum ARC 380 for this particular system (Ta—$AL_2O_3$) is 5.3 nm of Ta 310 on 44.9 nm of $Al_2O_3$ 320 as illustrated by the intersection of the x-axis 330 and the y-axis 340 on the graph 300. Other thickness 370, 360, 352, 350, 355, and 352 as shown on the graph 300, do not produce the optimal ARC 380. For other choices the optimum choice depends critically on the optical constants of all the materials and the wavelength.

The present invention is an improvement over other alternatives. Through its inherent conformality, it improves over spin-on BARCs (such as BARLi® Clariant) which, while effective, can have significant thickness variation (pooling) over topography which require significant CD-losing overetch during subsequent RIE processing. The present invention is an improvement over another alternative, Diamond-Like Carbon (DLC) films in that the present invention can be deposited with lower intrinsic mechanical stress. Such stress can create adhesion problems between BARC and substrate.

Also, a non-chlorine based chemistry may be used for patterning and stripping for some embodiments of the present invention. Several embodiments of the present invention will work without Cl, while others may require either Cl or alternatives as discussed above, e.g., sputter etch, milling or wet chemistry. For example, Ta, $Ta_2O_5$, $SiO_2$ and $Si_3N_4$ are all etchable without Cl, whereas other materials may require other techniques.

Figure 4:
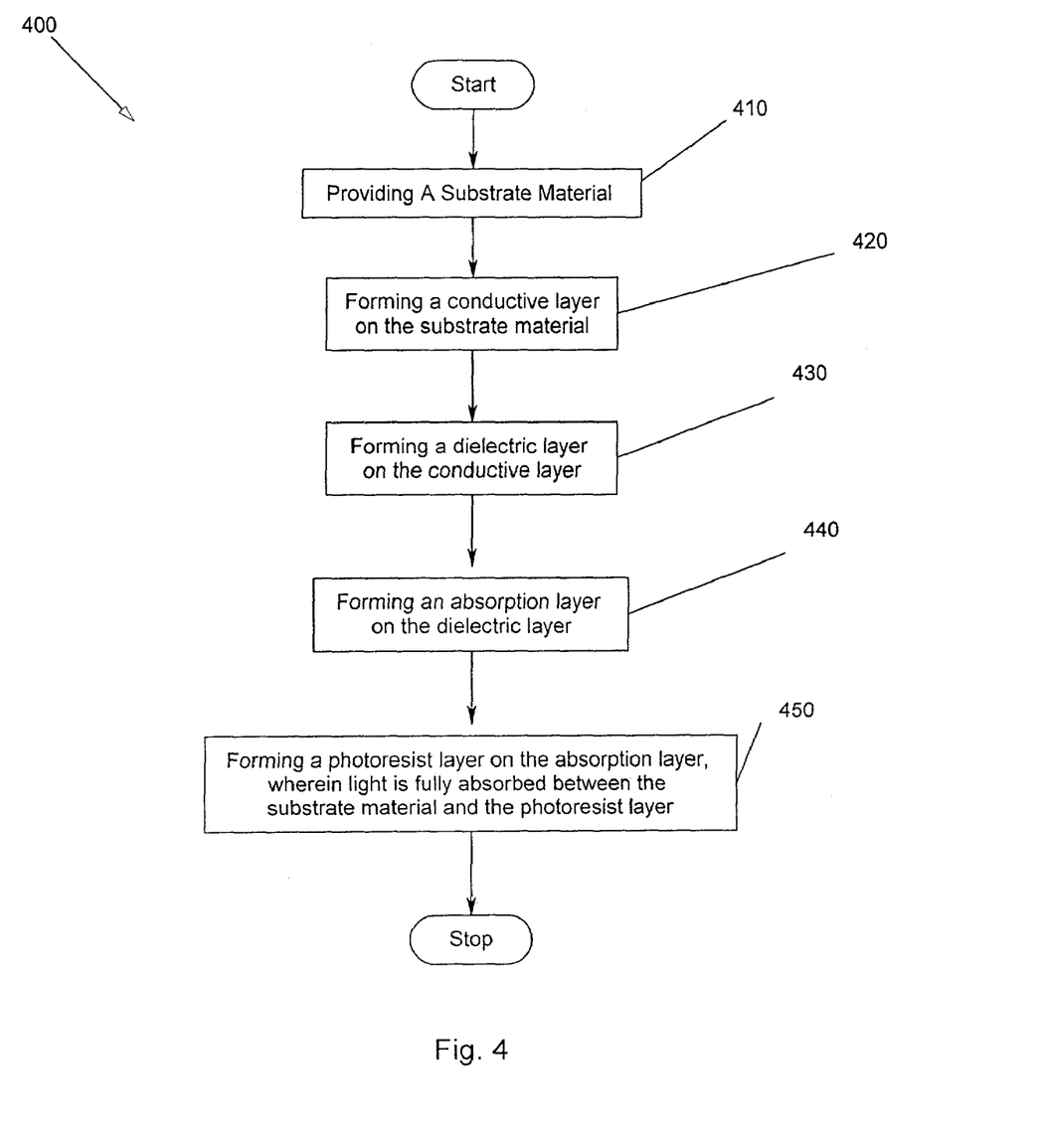
FIG. 4 is a flow chart of a process for creating a bi-layer bottom anti-reflection coating according to the present invention.

FIG. 4 is a flow chart of a process for creating a bi-layer bottom anti-reflection coating 400 according to an embodiment of the present invention. A substrate stack is provided 410. For example, a metal layer could be the substrate in TFH applications and the substrate could be Si in integrated circuit applications. A conductive layer is formed on the substrate material 420. While providing a substrate stack 410 and forming a conductive layer may be used, the present invention is directed to a metal-dielectric bi-layer anti-reflective coatings that minimize pattern distortion due to reflections from neighboring features and is not meant to be limited to providing a substrate stack 410 and forming a conductive layer 420.

A dielectric layer is then formed on the substrate layer by at least one vacuum deposition process 440. An absorption layer is formed on the dielectric layer by at least one vacuum deposition process 430. Finally, a photoresist layer is formed on the absorption layer, wherein light is fully absorbed between the substrate material and the photoresist layer 450.

Figure 5:
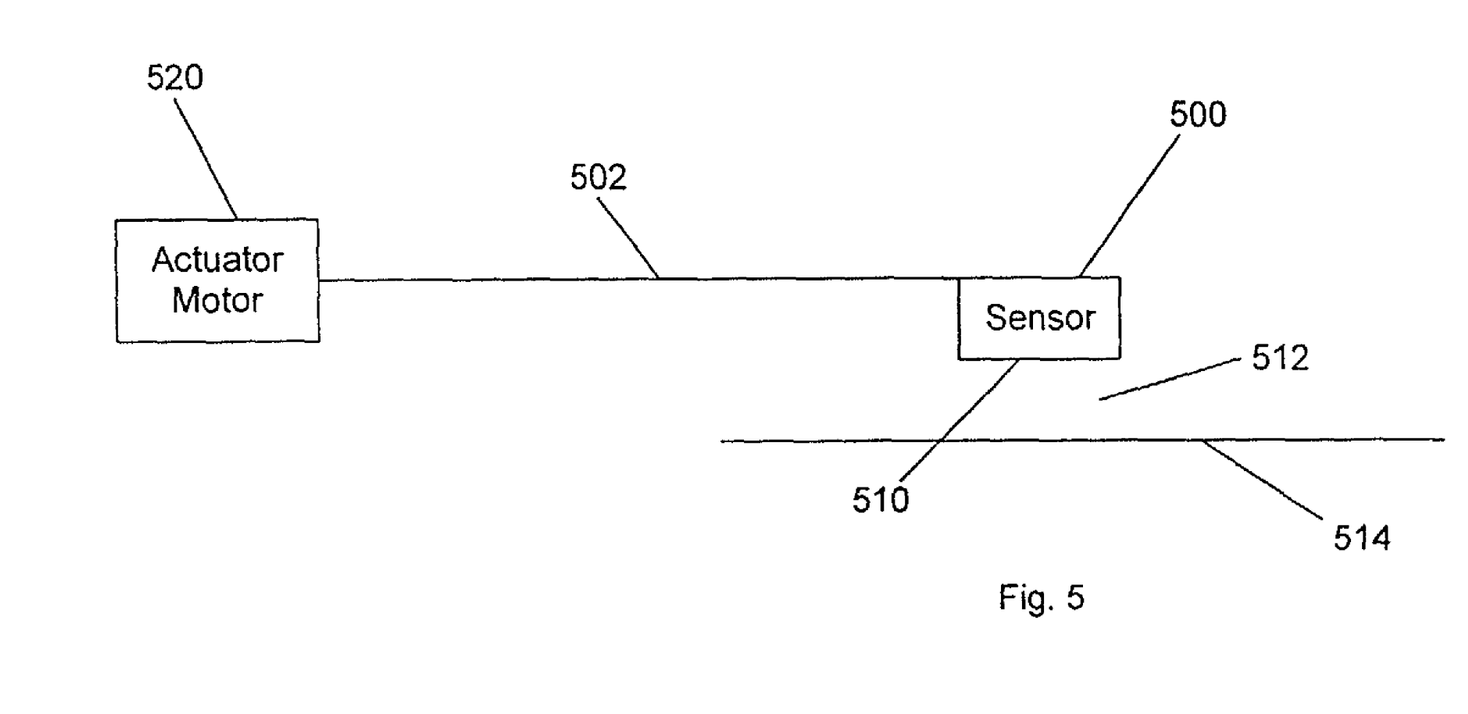
FIG. 5 illustrates a sensor which may formed according to the present invention.

With reference now to FIG. 5, there is depicted a schematic view of a sensor which may be formed using the method of the present invention. As illustrated, FIG. 5 depicts a plan view of the air-bearing surface of a sensor 500, e.g., a GMR head, MR head, tape head, etc. The air-bearing surface 510 of the sensor is mounted to a suspension or other mounting 502 and normally rides on a cushion of air 512, which separates it from a magnetic data storage medium 514, such as a disk or tape. The motion of the sensor 500 is controlled by an actuator motor 520 coupled to the mounting 502.

The foregoing description of the exemplary embodiment of the invention has been presented for the purposes of illustration and description. It is not intended to be exhaustive or to limit the invention to the precise form disclosed. Many modifications and variations are possible in light of the above teaching. It is intended that the scope of the invention be limited not with this detailed description, but rather by the claims appended hereto.

What is claimed is:

1. A structure for photolithographic processing, comprising:
   a wafer forming a foundation upon which other layers may be fabricated, the wafer having a non-planar surface;
   a conductive layer formed directly in contact with the wafer, the conductive layer having a stepped surface formed by different thicknesses of conductive material along the surface of the wafer;
   a two-layer anti-reflective structure disposed on and in contact with the conductive layer, the two-layer anti-reflective structure having a substantially uniform thickness along the non-planar surface of the conductive layer, the two-layer anti-reflective structure comprising:
      a first layer of a dielectric material formed with a substantially constant first thickness on and in contact with the conductive layer, the first layer of a dielectric material extending along the surface of the conductive layer and contouring with the stepped surface of the conductive layer; and
      a second layer of absorption material formed with a substantially constant second thickness on and in contact with the first layer of dielectric material, the second layer of absorption material extending along the surface of the first layer of a dielectric material and contouring with the surface of the first layer of a dielectric material; and
   a photoresist layer formed on and in contact with the second layer of absorption material and having a thickness that varies inversely to the change in thickness of the wafer such that the top surface of the photoresist layer is parallel to the bottom surface of the wafer;
   wherein the first thickness of the first layer of a dielectric material and the second thickness of the second layer of absorption material are selected to optimize the cummulative anti-reflection property of the two-layer anti-reflective structure by choosing the first thickness of the first layer of a dielectric material and the second thickness of the second layer of absorption material to intersect on a reflectance contour graph for the first layer of dielectric material and the second layer of absorption material to fully absorbed light between the conductive layer and the photoresist layer.

2. The structure for photolithographic processing of claim 1, wherein the first layer of a dielectric material has a substantially zero absorption for a predetermined wavelength.

3. The structure for photolithographic processing of claim 1, wherein the second layer of a absorption material has an extinction coefficient (k) not equal to zero for a predetermined wavelength.

4. The structure for photolithographic processing of claim 1, wherein the first layer of a dielectric material and the second layer of absorption material are formed by a vacuum deposition process.

5. The structure for photolithographic processing of claim 1, wherein the first layer of a dielectric material and the second layer of absorption material fully absorb light and wherein the the first layer of a dielectric material and the second layer of absorption material consists of one combination selected from $Ta/SiO_2$, $Ta/TiO_2$, $Ta/Ta_2O_5$, $Ta/Cr_2O_3$, $Ta/Si_3N_4$, $Ti/Al_2O_3$, $Ti/SiO_2$, $Ti/TiO_2$, $Ti/Ta_2O_5$, $Ti/Cr_2O_3$, $Ti/Si_3N_4$, $Cr/Al_2O_3$, $Cr/SiO_2$, $Cr/TiO_2$, $Cr/Ta_2O_5$, $Cr/Cr_2O_3$, $Cr/Si_3N_4$, $Al/Al_2O_3$, $Al/TiO_2$, $Al/Ta_2O_5$, $Al/Cr_2O_3$, $Al/Si_3N_4$, $Ni/Al_2O_3$, $Ni/SiO_2$, $Ni/TiO_2$, $Ni/Ta_2O_5$, $Ni/Cr_2O_3$, $Ni/Si_3N_4$, $Ir/Al_2O_3$, $Ir/SiO_2$, $Ir/TiO_2$, $Ir/Ta_2O_5$, $Ir/Cr_2O_3$, and $Ir/Si_3N_4$.

6. The structure for photolithographic processing of claim 1, wherein the first layer of a dielectric material and the second layer of absorption material fully absorb light and wherein the first layer of a dielectric material and the second layer of absorption material consists of one combination selected from $Ti/Al_2O_3$, $Ti/SiO_2$, $Ti/TiO_2$, $Ti/Ta_2O_5$, $Ti/Cr_2O_3$, $Ti/Si_3N_4$, $Cr/Al_2O_3$, $Cr/SiO_2$, $Cr/TiO_2$, $Cr/Ta_2O_5$, $Cr/Cr_2O_3$, $Cr/Si_3N_4$, $Al/Al_2O_3$, $Al/TiO_2$, $Al/Ta_2O_5$, $Al/Cr_2O_3$, $Al/Si_3N_4$, $Ni/Al_2O_3$, $Ni/SiO_2$, $Ni/TiO_2$, $Ni/Ta_2O_5$, $Ni/Cr_2O_3$, $Ni/Si_3N_4$, $Ir/Al_2O_3$, $Ir/SiO_2$, $Ir/TiO_2$, $Ir/Ta_2O_5$, $Ir/Cr_2O_3$, and $Ir/Si_3N_4$.

7. The structure for photolithographic processing of claim 1, wherein the first layer of a dielectric material and the second layer of absorption material fully absorb light and wherein the first layer of a dielectric material and the second layer of absorption material consists of one combination selected from $Ta/SiO_2$, $Ta/TiO_2$, $Ta/Ta_2O_5$, $Ta/Cr_2O_3$, $Ta/Si_3N_4$, $Ti/SiO_2$, $Ti/TiO_2$, $Ti/Ta_2O_5$, $Ti/Cr_2O_3$, $Ti/Si_3N_4$, $Cr/SiO_2$, $Cr/TiO_2$, $Cr/Ta_2O_5$, $Cr/Cr_2O_3$, $Cr/Si_3N_4$, $Al/TiO_2$, $Al/Ta_2O_5$, $Al/Cr_2O_3$, $Al/Si_3N_4$, $Ni/SiO_2$, $Ni/TiO_2$, $Ni/Ta_2O_5$, $Ni/Cr_2O_3$, $Ni/Si_3N_4$, $Ir/SiO_2$, $Ir/TiO_2$, $Ir/Ta_2O_5$, $Ir/Cr_2O_3$, and $Ir/Si_3N_4$.

8. The structure for photolithographic processing of claim 1, wherein the first layer of a dielectric material and the second layer of absorption material fully absorb light and wherein the the first layer of a dielectric material and the second layer of absorption material consists of one combination selected from $Ti/SiO_2$, $Ti/TiO_2$, $Ti/Ta_2O_5$, $Ti/Cr_2O_3$, $Ti/Si_3N_4$, $Cr/SiO_2$, $Cr/TiO_2$, $Cr/Ta_2O_5$, $Cr/Cr_2O_3$, $Cr/Si_3N_4$, $Al/TiO_2$, $Al/Ta_2O_5$, $Al/Cr_2O_3$, $Al/Si_3N_4$, $Ni/SiO_2$, $Ni/TiO_2$, $Ni/Ta_2O_5$, $Ni/Cr_2O_3$, $Ni/Si_3N_4$, $Ir/SiO_2$, $Ir/TiO_2$, $Ir/Ta_2O_5$, $Ir/Cr_2O_3$, and $Ir/Si_3N_4$.

9. The structure for photolithographic processing of claim 1, wherein the first thickness of the the first layer of a dielectric material and the second thickness of the second layer of absorption material are selected for fully absorbing light reflected off the non-planar surface of the conductive layer.

10. The structure for photolithographic processing of claim 9, wherein the first thickness of the the first layer of a dielectric material and the second thickness of the second layer of absorption material are selected by comparing a reflectivity for different thicknesses of the dielectric layer to a reflectivity for different thicknesses of the absorption layer and selecting the first thickness of the dielectric layer and the second thickness of the absorption layer that produces an overall minimum reflectivity.

11. The structure for photolithographic processing of claim 9, wherein the first thickness of the the first layer of a dielectric material and the second thickness of the second layer of absorption material are selected by maximizing interference of the first layer of a dielectric material and maximizing attenuation in the second layer of absorption material.

* * * * *